US011287458B2

(12) United States Patent
Ding et al.

(10) Patent No.: US 11,287,458 B2
(45) Date of Patent: Mar. 29, 2022

(54) DETERMINATION OF GAIN CHARACTERISTICS OF A LINEARLY-POLARIZED ANTENNA

(71) Applicant: City University of Hong Kong, Kowloon (HK)

(72) Inventors: Chen Ding, Kowloon (HK); Kwai-Man Luk, Kowloon (HK)

(73) Assignee: City University of Hong Kong, Kowloon (HK)

( * ) Notice: Subject to any disclaimer, the term of this patent is extended or adjusted under 35 U.S.C. 154(b) by 197 days.

(21) Appl. No.: 16/837,475

(22) Filed: Apr. 1, 2020

(65) Prior Publication Data

US 2021/0311103 A1 Oct. 7, 2021

(51) Int. Cl.
| | |
|---|---|
| *G01R 29/10* | (2006.01) |
| *G01R 29/08* | (2006.01) |
| *H01Q 25/00* | (2006.01) |
| *H01Q 21/24* | (2006.01) |

(52) U.S. Cl.
CPC ......... *G01R 29/10* (2013.01); *G01R 29/0878* (2013.01); *H01Q 21/24* (2013.01); *H01Q 25/001* (2013.01)

(58) Field of Classification Search
CPC ... G01R 29/0878; H01Q 21/24; H01Q 25/001
See application file for complete search history.

(56) References Cited

U.S. PATENT DOCUMENTS

| | | | |
|---|---|---|---|
| 2009/0146883 A1* | 6/2009 | Chin | H01Q 9/045 343/700 MS |
| 2019/0190160 A1* | 6/2019 | Hollenbeck | H01Q 15/242 |
| 2019/0229424 A1* | 7/2019 | Leung | H01Q 9/0492 |

(Continued)

OTHER PUBLICATIONS

C. Ding and K.-M. Luk, "Wideband High-Gain Circularly Polarized Antenna Using Artificial Anisotropic Polarizer," IEEE Trans. Antennas Propag., vol. 67, No. 10, pp. 6645-6649, Oct. 2019.

(Continued)

*Primary Examiner* — Alvaro E Fortich
(74) *Attorney, Agent, or Firm* — Renner Kenner Greive Bobak Taylor & Weber

(57) ABSTRACT

System and method for determining gain characteristics of a linearly-polarized antenna. The method includes receiving a measured first amplitude of a forward gain between a circularly-polarized antenna probe and a linearly-polarized standard-gain antenna, a measured second amplitude of a forward gain between the circularly-polarized antenna probe and a linearly-polarized antenna under test, a measured third amplitude of a forward gain between a linearly-polarized antenna probe and the linearly-polarized standard-gain antenna, and a measured fourth amplitude of a forward gain between the linearly-polarized antenna probe and the linearly-polarized antenna under test. The method also includes determining a co-polarization gain and a cross-polarization gain of the linearly-polarized antenna under test based on the measured first amplitude, the measured second amplitude, the measured third amplitude, and the measured fourth amplitude. The determination may be performed using one or more processors.

20 Claims, 7 Drawing Sheets

(56) References Cited

U.S. PATENT DOCUMENTS

2019/0379104 A1* 12/2019 Leung ............... H01Q 1/46
2019/0379117 A1* 12/2019 Tidhar ............... H04B 17/24

OTHER PUBLICATIONS

C. Ding and K.-M. Luk, "A Wideband High-Gain Circularly-Polarized Antenna Using Artificial Anisotropic Polarizer." IEEE Trans. Antennas Propag., vol. 67, No. 10, pp. 6645-6649, Oct. 2019.

* cited by examiner

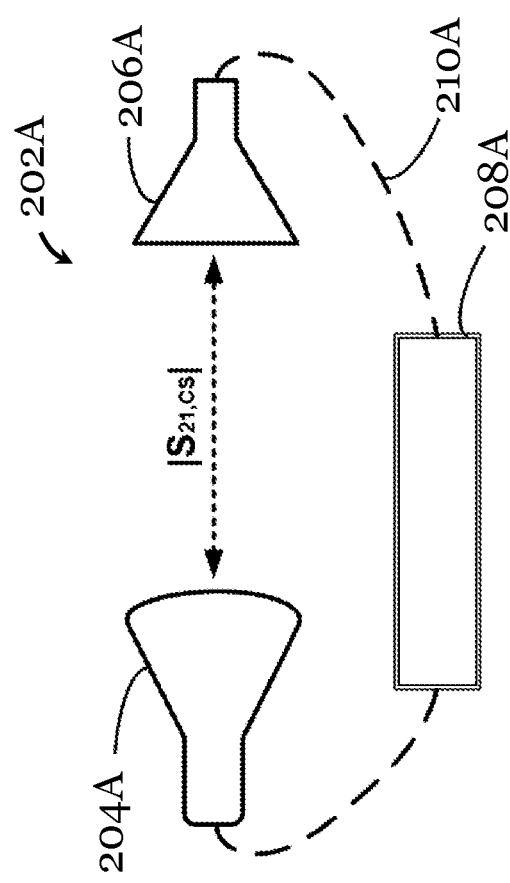
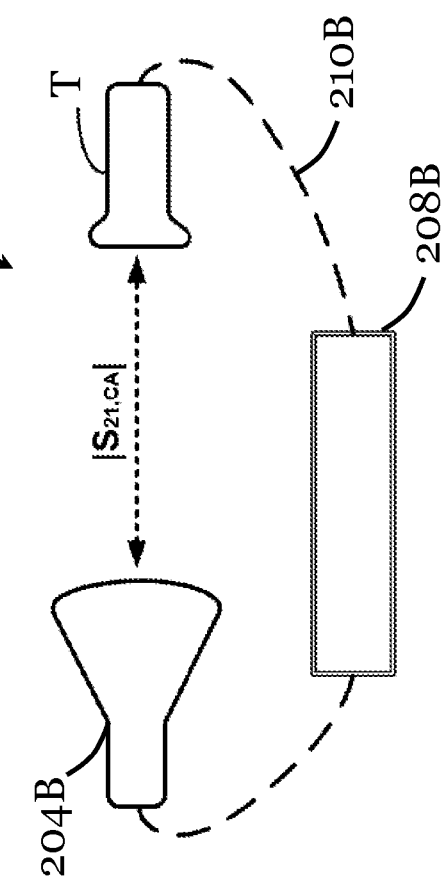
Figure 2A
Figure 2B

DETERMINATION OF GAIN CHARACTERISTICS OF A LINEARLY-POLARIZED ANTENNA

TECHNICAL FIELD

The invention relates to determination of gain characteristics of a linearly-polarized antenna.

BACKGROUND

Linearly-polarized gain(s) of a linearly-polarized antenna can be measured to evaluate the performance or properties of the antenna. Conventional methods for measuring co-polarization and cross-polarization gains of linearly-polarized antenna require complicated set-up and rotation of antenna probes or linearly-polarized antennas under test using rotation means or device during measurement. The use of rotation means or device increases the complexity of the entire measurement system. Also, without high-frequency rotation joints, the rotation of the antenna is difficult to realize. For applications or antennas at millimeter-wave and terahertz ranges, frequency extenders that are required for measurement are expensive, bulky (hence difficult to manipulate) and are delicate (hence prone to be damaged when moved or rotated).

SUMMARY OF THE INVENTION

It is an object of the invention to address the above needs, to overcome or substantially ameliorate the above disadvantages or, more generally, to provide an improved or alternative system and method for determining gain characteristics of a linearly-polarized antenna.

In a first aspect of the invention, there is provided a method for determining gain characteristics of a linearly-polarized antenna. The method includes receiving a measured first amplitude of a forward gain between a circularly-polarized antenna probe and a linearly-polarized standard-gain antenna, a measured second amplitude of a forward gain between the circularly-polarized antenna probe and a linearly-polarized antenna under test, a measured third amplitude of a forward gain between a linearly-polarized antenna probe and the linearly-polarized standard-gain antenna, and a measured fourth amplitude of a forward gain between the linearly-polarized antenna probe and the linearly-polarized antenna under test. The method also includes determining a co-polarization gain and a cross-polarization gain of the linearly-polarized antenna under test based on the measured first amplitude, the measured second amplitude, the measured third amplitude, and the measured fourth amplitude. The linearly-polarized antenna probe may have a cross-polarization level that is insignificant. The circularly-polarized antenna probe may have a cross-polarization level that is insignificant.

In one embodiment of the first aspect, the method also includes measuring a first amplitude of a forward gain between the circularly-polarized antenna probe and the linearly-polarized standard-gain antenna to obtain the measured first amplitude. Measuring the first amplitude of the forward gain between the circularly-polarized antenna probe and the linearly-polarized standard-gain antenna may include: positioning, relatively, the circularly-polarized antenna probe and the linearly-polarized standard-gain antenna, and transmitting signals from one of the circularly-polarized antenna probe and the linearly-polarized standard-gain antenna to the other one of the circularly-polarized antenna probe and the linearly-polarized standard-gain antenna for measurement. The forward gain may be forward voltage gain. Optionally, during the measurement, the phase center between the receiving and transmitting device is larger than the far-field range of each device.

In one embodiment of the first aspect, the method also includes measuring a second amplitude of a forward gain between the circularly-polarized antenna probe and the linearly-polarized antenna under test to obtain the measured second amplitude. Measuring the second amplitude of the forward gain between the circularly-polarized antenna probe and the linearly-polarized antenna under test may include: positioning, relatively, the circularly-polarized antenna probe and the linearly-polarized antenna under test, and transmitting signals from one of the circularly-polarized antenna probe and the linearly-polarized antenna under test to the other one of the circularly-polarized antenna probe and the linearly-polarized antenna under test for measurement. The forward gain may be forward voltage gain. Optionally, during the measurement, the phase center between the receiving and transmitting device is larger than the far-field range of each device.

In one embodiment of the first aspect, the method also includes measuring a third amplitude of a forward gain between the linearly-polarized antenna probe and the linearly-polarized standard-gain antenna to obtain the measured third amplitude. Measuring the third amplitude of the forward gain between the linearly-polarized antenna probe and the linearly-polarized standard-gain antenna may include: positioning, relatively, linearly-polarized antenna probe and the linearly-polarized standard-gain antenna, and transmitting signals from one of linearly-polarized antenna probe and the linearly-polarized standard-gain antenna to the other one of the linearly-polarized antenna probe and the linearly-polarized standard-gain antenna for measurement. The forward gain may be forward voltage gain. Optionally, during the measurement, the phase center between the receiving and transmitting device is larger than the far-field range of each device.

In one embodiment of the first aspect, the method also includes measuring a fourth amplitude of a forward gain between the linearly-polarized antenna probe and the linearly-polarized antenna under test to obtain the measured fourth amplitude. Measuring the fourth amplitude of the forward gain between the linearly-polarized antenna probe and the linearly-polarized antenna under test may include: positioning, relatively, the circularly-polarized antenna probe and the linearly-polarized standard-gain antenna, and transmitting signals from one of the circularly-polarized antenna probe and the linearly-polarized standard-gain antenna to the other one of the circularly-polarized antenna probe and the linearly-polarized standard-gain antenna for measurement. The forward gain may be forward voltage gain. Optionally, during the measurement, the phase center between the receiving and transmitting device is larger than the far-field range of each device.

In one embodiment of the first aspect, the circularly-polarized antenna probe comprises a linearly-polarized antenna and a polarizer. The linearly-polarized antenna may include a rectangular horn antenna having a feeding waveguide and a rectangular horn structure. The feeding waveguide may be connected to a coaxial line with an adapter.

In one embodiment of the first aspect, the method also includes: measuring a first amplitude of a forward gain between the circularly-polarized antenna probe and the linearly-polarized standard-gain antenna to obtain the measured first amplitude; measuring a second amplitude of a forward gain between the circularly-polarized antenna probe and the linearly-polarized antenna under test to obtain the measured second amplitude; measuring a third amplitude of a forward gain between the linearly-polarized antenna probe and the linearly-polarized standard-gain antenna to obtain the measured third amplitude; and measuring a fourth amplitude of a forward gain between the linearly-polarized antenna probe and the linearly-polarized antenna under test to obtain the measured fourth amplitude. The order of the measurement steps can be implemented differently. Optionally, a relative position between the circularly-polarized antenna probe and the linearly-polarized standard-gain antenna during the measurement of the first amplitude, a relative position between the circularly-polarized antenna probe and the linearly-polarized antenna under test during the measurement of the second amplitude, a relative position between the linearly-polarized antenna probe and the linearly-polarized standard-gain antenna during the measurement of the third amplitude, and a relative position between the linearly-polarized antenna probe and the linearly-polarized antenna under test during the measurement of the fourth amplitude are substantially the same. The first amplitude, the second amplitude, the third amplitude, and the fourth amplitude may be measured using the same measurement device. The measurement device may include a spectrum analyzer and a signal generator. The signal generator may be used to generate signals for transmission in the measuring steps. Optionally, the phase center between the receiving and transmitting devices across different measurements is substantially constant.

In one embodiment of the first aspect, the co-polarization gain and the cross-polarization gain of the linearly-polarized antenna under test are determined based on:

$$G_{AUT,co} = \frac{G_{SGA,LP}}{(\cos^2\varphi_{LA} - \sin^2\varphi_{LA})} \cdot \left( \frac{|S_{21,LA}|^2}{|S_{21,LS}|^2}\cos^2\varphi_{LS} - \frac{|S_{21,CA}|^2}{|S_{21,CS}|^2}\sin^2\varphi_{LA} \right)$$

$$G_{AUT,crx} = \frac{G_{SGA,LP}}{(\cos^2\varphi_{LA} - \sin^2\varphi_{LA})} \cdot \left( \frac{|S_{21,CA}|^2}{|S_{21,CS}|^2}\cos^2\varphi_{LA} - \frac{|S_{21,LA}|^2}{|S_{21,LS}|^2}\cos^2\varphi_{LS} \right)$$

where $G_{AUT,co}$ is the co-polarization gain of the linearly-polarized antenna under test, $G_{AUT,crx}$ is the cross-polarization gain of the linearly-polarized antenna under test, $G_{SGA,LP}$ is a linearly-polarized gain of the linearly-polarized standard-gain antenna, $|S_{21,CS}|$ is the measured first amplitude, $|S_{21,CA}|$ is the measured second amplitude, $|S_{21,LS}|$ is the measured third amplitude, $|S_{21,LA}|$ is the measured fourth amplitude, $\varphi_{LS}$ is an angle between an E-plane of the linearly-polarized antenna probe and an E-plane of the linearly-polarized standard-gain antenna during measurement of the third amplitude, and $\varphi_{LA}$ is an angle between an E-plane of the linearly-polarized antenna probe and an E-plane of the linearly-polarized antenna under test during measurement of the fourth amplitude. The co-polarization gain and the cross-polarization gain of the linearly-polarized antenna under test may be determined using one or more processors. In one example, $\varphi_{LS}$ is substantially equal to zero to maximize the forward gain. In one example, $\varphi_{LA}$ is substantially equal to zero to maximize the forward gain.

In one embodiment of the first aspect, the linearly-polarized antenna under test is arranged for operation in millimeter-wave and terahertz ranges.

In a second aspect of the invention, there is provided a method for evaluating a performance of a linearly-polarized antenna. The method includes determining gain characteristics of a linearly-polarized antenna using the method the first aspect, and determining the radiation pattern of the linearly-polarized antenna. The radiation pattern may be determined by changing the relative position and angle between the receiving and transmitting devices during the measuring steps for determining the second and fourth amplitudes.

In a third aspect of the invention, there is provided a system for determining gain characteristics of a circularly-polarized antenna. The system includes one or more processors arranged to: receive a measured first amplitude of a forward gain between a circularly-polarized antenna probe and a linearly-polarized standard-gain antenna, a measured second amplitude of a forward gain between the circularly-polarized antenna probe and a linearly-polarized antenna under test, a measured third amplitude of a forward gain between a linearly-polarized antenna probe and the linearly-polarized standard-gain antenna, and a measured fourth amplitude of a forward gain between the linearly-polarized antenna probe and the linearly-polarized antenna under test; and determine a co-polarization gain and a cross-polarization gain of the linearly-polarized antenna under test based on the measured first amplitude, the measured second amplitude, the measured third amplitude, and the measured fourth amplitude. The linearly-polarized antenna probe may have a cross-polarization level that is insignificant. The circularly-polarized antenna probe may have a cross-polarization level that is insignificant.

In one embodiment of the third aspect, the system also includes a measurement device arranged to: measure a first amplitude of a forward gain between the circularly-polarized antenna probe and the linearly-polarized standard-gain antenna to obtain the measured first amplitude; measure a second amplitude of a forward gain between the circularly-polarized antenna probe and the linearly-polarized antenna under test to obtain the measured second amplitude; measure a third amplitude of a forward gain between the linearly-polarized antenna probe and the linearly-polarized standard-gain antenna to obtain the measured third amplitude; and measure a fourth amplitude of a forward gain between the linearly-polarized antenna probe and the linearly-polarized antenna under test to obtain the measured fourth amplitude. The measurement device may include a spectrum analyzer and a signal generator. The signal generator may be used to generate signals for transmission in the measuring steps.

In one embodiment of the third aspect, the one or more processors are arranged to determine the co-polarization gain and the cross-polarization gain of the linearly-polarized antenna under test based on:

$$G_{AUT,co} = \frac{G_{SGA,LP}}{(\cos^2\varphi_{LA} - \sin^2\varphi_{LA})} \cdot \left( \frac{|S_{21,LA}|^2}{|S_{21,LS}|^2}\cos^2\varphi_{LS} - \frac{|S_{21,CA}|^2}{|S_{21,CS}|^2}\sin^2\varphi_{LA} \right)$$

$$G_{AUT,crx} = \frac{G_{SGA,LP}}{(\cos^2\varphi_{LA} - \sin^2\varphi_{LA})} \cdot \left( \frac{|S_{21,CA}|^2}{|S_{21,CS}|^2}\cos^2\varphi_{LA} - \frac{|S_{21,LA}|^2}{|S_{21,LS}|^2}\cos^2\varphi_{LS} \right)$$

where $G_{AUT,co}$ is the co-polarization gain of the linearly-polarized antenna under test, $G_{AUT,crx}$ is the cross-polarization gain of the linearly-polarized antenna under test, $G_{SGA,LP}$ is a linearly-polarized gain of the linearly-polarized standard-gain antenna, $|S_{21,CS}|$ is the measured first amplitude, $|S_{21,CA}|$ is the measured second amplitude, $|S_{21,LS}|$ is the measured third amplitude, $|_{21,LA}|$ is the measured fourth amplitude, $\varphi_{LS}$ is an angle between an E-plane of the linearly-polarized antenna probe and an E-plane of the linearly-polarized standard-gain antenna during measurement of the third amplitude, and $\varphi_{LA}$ is an angle between an E-plane of the linearly-polarized antenna probe and an E-plane of the linearly-polarized antenna under test during measurement of the fourth amplitude. In one example, $\varphi_{LS}$ is substantially equal to zero to maximize the forward gain. In one example, $\varphi_{LA}$ is substantially equal to zero to maximize the forward gain.

In one embodiment of the third aspect, the circularly-polarized antenna probe comprises a linearly-polarized antenna and a polarizer. The linearly-polarized antenna may include a rectangular horn antenna having a feeding waveguide and a rectangular horn structure. The feeding waveguide may be connected to a coaxial line with an adapter.

In one embodiment of the third aspect, the linearly-polarized antenna under test is arranged for operation in millimeter-wave and terahertz ranges.

In accordance with a fourth aspect of the invention, there is provided a non-transistory computer readable medium storing computer instructions that, when executed by one or more processors, are arranged to cause the one or more processors to perform the method of the first aspect.

In accordance with a fifth aspect of the invention, there is provided a non-transistory computer readable medium storing computer instructions that, when executed by one or more processors, are arranged to cause the one or more processors to perform a method for determining gain characteristics of a linearly-polarized antenna, the method including: determining a co-polarization gain and a cross-polarization gain of a linearly-polarized antenna under test are determined based on:

$$G_{AUT,co} = \frac{G_{SGA,LP}}{(\cos^2\varphi_{LA} - \sin^2\varphi_{LA})} \cdot \left( \frac{|S_{21,LA}|^2}{|S_{21,LS}|^2} \cos^2\varphi_{LS} - \frac{|S_{21,CA}|^2}{|S_{21,CS}|^2} \sin^2\varphi_{LA} \right)$$

$$G_{AUT,crx} = \frac{G_{SGA,LP}}{(\cos^2\varphi_{LA} - \sin^2\varphi_{LA})} \cdot \left( \frac{|S_{21,CA}|^2}{|S_{21,CS}|^2} \cos^2\varphi_{LA} - \frac{|S_{21,LA}|^2}{|S_{21,LS}|^2} \cos^2\varphi_{LS} \right)$$

where $G_{AUT,co}$ is the co-polarization gain of the linearly-polarized antenna under test, $G_{AUT,crx}$ is the cross-polarization gain of the linearly-polarized antenna under test, $G_{SGA,LP}$ is a linearly-polarized gain of a linearly-polarized standard-gain antenna, $|S_{21,CS}|$ is a measured first amplitude of a forward gain between a circularly-polarized antenna probe and a linearly-polarized standard-gain antenna, $|S_{21,CA}|$ is a measured second amplitude of a forward gain between the circularly-polarized antenna probe and a linearly-polarized antenna under test, $|S_{21,LS}|$ is a measured third amplitude of a forward gain between a linearly-polarized antenna probe and the linearly-polarized standard-gain antenna, $|S_{21,LA}|$ is a measured fourth amplitude of a forward gain between the linearly-polarized antenna probe and the linearly-polarized antenna under test, $\varphi_{LS}$ is an angle between an E-plane of the linearly-polarized antenna probe and an E-plane of the linearly-polarized standard-gain antenna during measurement of the third amplitude, and $\varphi_{LA}$ is an angle between an E-plane of the linearly-polarized antenna probe and an E-plane of the linearly-polarized antenna under test during measurement of the fourth amplitude. In one example, $\varphi_{LS}$ is substantially equal to zero to maximize the forward gain. In one example, $\varphi_{LA}$ is substantially equal to zero to maximize the forward gain.

BRIEF DESCRIPTION OF THE DRAWINGS

Embodiments of the invention will now be described, by way of example, with reference to the accompanying drawings in which:

FIG. 2A is schematic diagram showing a setup for measuring an amplitude of a forward gain between a circularly-polarized antenna probe and a linearly-polarized standard-gain antenna;

FIG. 2B is schematic diagram showing a setup for measuring an amplitude of a forward gain between a circularly-polarized antenna probe (e.g., the one in FIG. 2A) and a linearly-polarized antenna under test;

DETAILED DESCRIPTION

Figure 1:
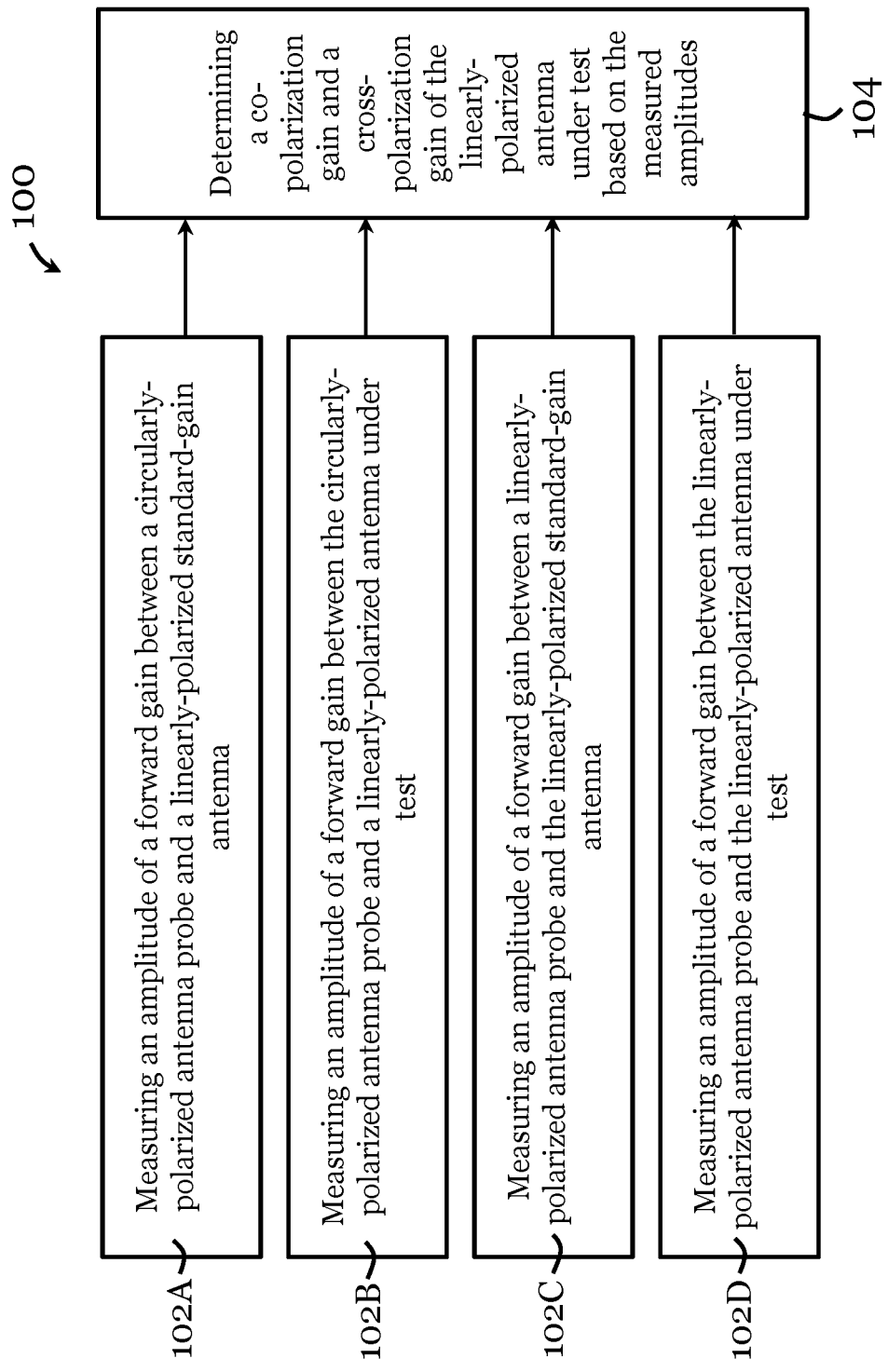
FIG. 1 is a flowchart showing a method for determining gain characteristics of a linearly-polarized antenna in one embodiment of the invention.

FIG. 1 illustrates a method 100 for determining gain characteristics of a linearly-polarized antenna in one embodiment of the invention. The linearly-polarized antenna under test in this method 100 is arranged for operation in millimeter-wave and terahertz ranges.

The method 100 includes, in step 102A, measuring an amplitude of a forward gain (e.g., forward voltage gain) between a circularly-polarized antenna probe and a linearly-polarized standard-gain antenna. The measurement in step 102A includes connecting the circularly-polarized antenna probe and the linearly-polarized standard-gain antenna to a measurement device, positioning the circularly-polarized antenna probe and the linearly-polarized standard-gain antenna relative to each other, and transmitting signals from one of the circularly-polarized antenna probe and the linearly-polarized standard-gain antenna to the other one of the circularly-polarized antenna probe and the linearly-polarized standard-gain antenna.

The method 100 also includes, in step 102B, measuring an amplitude of a forward gain (e.g., forward voltage gain) between a circularly-polarized antenna probe (e.g., the one in step 102A) and a linearly-polarized antenna under test. The measurement in step 102B includes connecting the circularly-polarized antenna probe and the linearly-polarized antenna under test to a measurement device, positioning the circularly-polarized antenna probe and the linearly-polarized antenna under test relative to each other, and transmitting signals from one of the circularly-polarized antenna probe and the linearly-polarized antenna under test to the other one of the circularly-polarized antenna probe and the linearly-polarized antenna under test. The measurement device used may be the measurement device used in step 102A.

The method 100 also includes, in step 102C, measuring an amplitude of a forward gain (e.g., forward voltage gain) between a linearly-polarized antenna probe and a linearly-polarized standard-gain antenna (e.g., the one in step 102A). The measurement in step 102C includes connecting the linearly-polarized antenna probe and the linearly-polarized standard-gain antenna to a measurement device, positioning the linearly-polarized antenna probe and the linearly-polarized standard-gain antenna relative to each other, and transmitting signals from one of the linearly-polarized antenna probe and the linearly-polarized standard-gain antenna to the other one of the linearly-polarized antenna probe and the linearly-polarized standard-gain antenna. The measurement device used may be the measurement device used in step 102A and/or step 102B.

The method 100 also includes, in step 102D, measuring an amplitude of a forward gain (e.g., forward voltage gain) between a linearly-polarized antenna probe (e.g., the one in step 102C) and the linearly-polarized antenna under test (i.e., the one in step 102B). The measurement in step 102D includes connecting the linearly-polarized antenna probe and the linearly-polarized antenna under test to a measurement device, positioning the linearly-polarized antenna probe and the linearly-polarized antenna under test relative to each other, and transmitting signals from one of the linearly-polarized antenna probe and the linearly-polarized antenna under test to the other one of the linearly-polarized antenna probe and the linearly-polarized antenna under test. The measurement device used may be the measurement device used in step 102A, step 102B, and/or step 102C.

After the measurement in steps 102A to 102D, which can be performed in any order, the method 100 proceeds to step 104, in which a co-polarization gain and a cross-polarization gain of the linearly-polarized antenna under test are determined based on the measured amplitudes obtained in steps 102A to 102D. The determination in step 104 is performed by one or more processors.

By Friis transmission equation, the measured amplitudes of the forward gains obtained from steps 102A to 102D ($|S_{21,CS}|$ is the measured amplitude in step 102A, $|S_{21,CA}|$ is the measured amplitude in step 102B, $|S_{21,LS}|$ is the measured amplitude in step 102C, $|S_{21,LA}|$ is the measured amplitude in step 102D) can be expressed as:

$$|S_{21,CS}|^2 = \left( \frac{G_{CP,LHCP}G_{SGA,LP}}{2} + \frac{G_{CP,RHCP}G_{SGA,LP}}{2} \right) \cdot \left( \frac{\lambda}{4\pi d} \right)^2 \cdot G_{loss} \quad (1)$$

$$|S_{21,CA}|^2 = \begin{pmatrix} \frac{G_{CP,LHCP}(G_{AUT,co}+G_{AUT,crx})}{2} + \\ \frac{G_{CP,RHcircularly-polarized}(G_{AUT,co}+G_{AUT,crx})}{2} \end{pmatrix} \cdot \left( \frac{\lambda}{4\pi d} \right)^2 \cdot G_{loss} \quad (2)$$

$$|S_{21,LS}|^2 = \left( G_{LP,co} G_{standard-gain\ antenna,LP} \cos^2\varphi_{LS} \right) \cdot \left( \frac{\lambda}{4\pi d} \right)^2 \cdot G_{loss} \quad (3)$$

$$|S_{21,LA}|^2 = \left( G_{LP,co} G_{linearly-polarized\ antenna\ under\ test,co} \cos^2\varphi_{LA} + \\ G_{LP,co} G_{linearly-polarized\ antenna\ under\ test,crx} \sin^2\varphi_{LA} \right) \cdot \left( \frac{\lambda}{4\pi d} \right)^2 \cdot G_{loss} \quad (4)$$

where $G_{CP,LHCP}$ is the left-hand circularly-polarized gain of the circularly-polarized antenna probe, $G_{CP,RHCP}$ is the right-hand circularly-polarized gain of the circularly-polarized antenna probe, $G_{SGA,LP}$ is the linearly-polarized gain of the linearly-polarized standard-gain antenna, $G_{AUT,co}$ is the co-polarization gain of the linearly-polarized antenna under test, $G_{AUT,crx}$ is the cross-polarization gain of the linearly-polarized antenna under test, $G_{LP,co}$ is the co-polarization gain of the linearly-polarized antenna probe, $G_{loss}$ is the loss in the signal transmission path, λ is the wave length relating to the measuring frequency, d is the distance between the phase centers of the receiving and transmitting devices (probe or antenna), $\varphi_{LS}$ is the angle between the E-planes of the linearly-polarized antenna probe and the standard-gain antenna and $\varphi_{LA}$ is the angle between the E-planes of the linearly-polarized antenna probe and the linearly-polarized antenna under test. The loss in signal transmission path may be due to antenna feed, air absorption, measuring equipment, etc.

From equations (1) to (4), the co-polarization gain $G_{LP,co}$ and the cross-polarization gain $G_{AUT,co}$ of the linearly-polarized antenna under test can be determined based on:

$$G_{AUT,co} = \frac{G_{SGA,LP}}{(\cos^2\varphi_{LA} - \sin^2\varphi_{LA})} \cdot \left( \frac{|S_{21,LA}|^2}{|S_{21,LS}|^2} \cos^2\varphi_{LS} - \frac{|S_{21,CA}|^2}{|S_{21,CS}|^2} \sin^2\varphi_{LA} \right) \quad (5)$$

$$G_{AUT,crx} = \quad (6)$$
$$\frac{G_{SGA,LP}}{(\cos^2\varphi_{LA} - \sin^2\varphi_{LA})} \cdot \left( \frac{|S_{21,CA}|^2}{|S_{21,CS}|^2} \cos^2\varphi_{LA} - \frac{|S_{21,LA}|^2}{|S_{21,LS}|^2} \cos^2\varphi_{LS} \right)$$

In method too, the linearly-polarized antenna probe and the circularly-polarized antenna probe both have a cross-polarization level that is insignificant (i.e., does not substantially affect accuracy of measurement). The circularly-polarized antenna probe may be formed by a linearly-polarized antenna and a polarizer. The linearly-polarized antenna may include a rectangular horn antenna having a feeding waveguide and a rectangular horn structure. The feeding waveguide may be connected to a coaxial line with an adapter.

In method too, the measurement device(s) used in steps 102A to 102D may include a spectrum analyzer and a signal generator. The signal generator is arranged to generate signals for transmission in the measuring steps 102A to 102D. The measurement device(s) may include the one or more processors for performing the determination step 104. Alternatively, the one or more processors for performing the determination step 104 are separate from the measurement device(s). Also, during measurements in steps 102A to 102D, the relative positions between the two devices (probe or antenna) are substantially the same. In this example, the phase center between the pair of receiving and transmitting devices (probe or antenna) is substantially constant (across steps 102A to 102D) and larger than the far-field range of each antenna or probe.

The method 100 may further include determining or mapping a radiation pattern of the linearly-polarized antenna under test by changing the relative position and/or angle between the pair of receiving and transmitting devices (probe or antenna) during the measuring steps 102B and to 102D.

FIG. 2A shows an exemplary setup 202A for performing step 102A. In FIG. 2A, the setup 102A includes a circularly-polarized antenna probe 204A and a linearly-polarized standard-gain antenna 206A connected to a measurement device 208A via respective antenna feed lines 210A. The circularly-polarized antenna probe 204A has a high gain to provide a high signal-to-noise ratio in the transmission path. A distance between the probe 204A and the antenna 206A is larger than the far-field range of each of the probe 204A and the antenna 206A. The measurement device 208A may include a vector network analyzer, or a signal generator and a spectrum analyzer, or any of their combination. A signal amplifier (not shown) could be used between the measurement device 208A and the probe 204A or between the measurement device 208A and the antenna 206A to boost the signal amplitude. The phase centers of the probe 204A and the antenna 206A are aligned.

FIG. 2B shows an exemplary setup 202B for performing step 102B. In FIG. 2B, the setup 202B is the same to that in FIG. 2A except that the linearly-polarized standard-gain antenna is replaced by a linearly-polarized antenna under test. In FIG. 2B, the setup 202B includes a circularly-polarized antenna probe 204B (e.g., the one in setup 202A) and a linearly-polarized antenna under test T connected to a measurement device 208B via respective antenna feed lines 210B. The distance between the phase centers of the circularly-polarized antenna probe 204B and the linearly-polarized antenna under test T remains substantially the same to that of FIG. 2A. The linearly-polarized antenna under test T can be re-positioned by external positioner (not shown) for mapping and determining radiation pattern (e.g. using the measurement device 208B).

Figure 2C:
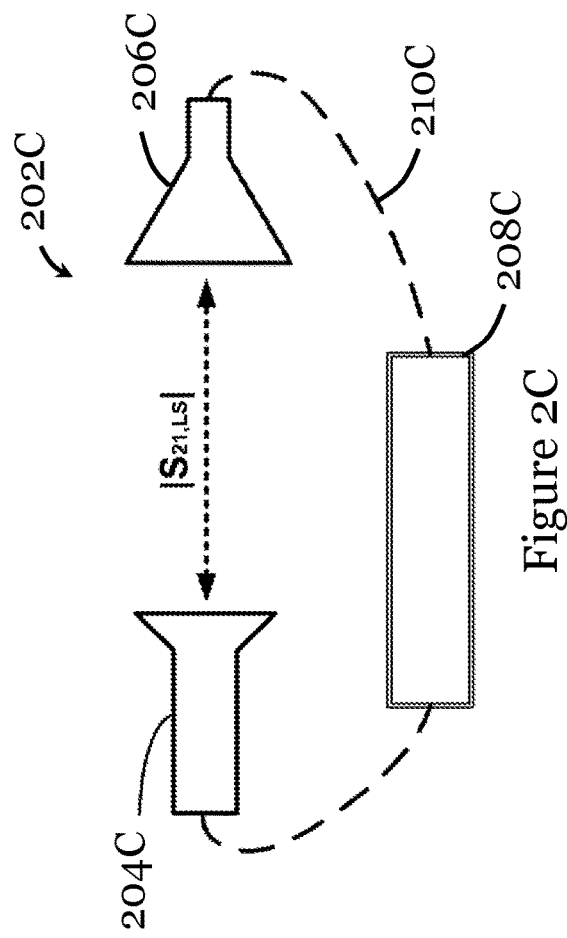
FIG. 2C is schematic diagram showing a setup for measuring an amplitude of a forward gain between a linearly-polarized antenna probe and a linearly-polarized standard-gain antenna (e.g., the one in FIG. 2A)

FIG. 2C shows an exemplary setup 202C for performing step 102C. In FIG. 2C, the setup 202C is the same to that in FIG. 2A except that the circularly-polarized antenna probe is replaced by a linearly-polarized antenna probe. In FIG. 2C, the setup 202C includes a linearly-polarized antenna probe 204C and a linearly-polarized standard-gain antenna 206C (e.g., the one in setup 202A) connected to a measurement device 208C via respective antenna feed lines 210C. The distance between the phase centers of the probe 204C and the antenna 206C remains substantially the same to that of FIG. 2A. In setup 202C, the angle between the E-planes of the probe 204C and the antenna 206C is $\varphi_{LS}$, which is preferably small (e.g., substantially equals to zero degree) in order to maximize the forward gain. The linearly-polarized antenna probe 204C and the circularly-polarized antenna probe 204A both have a cross-polarization level that is insignificant to the measurement.

Figure 2D:
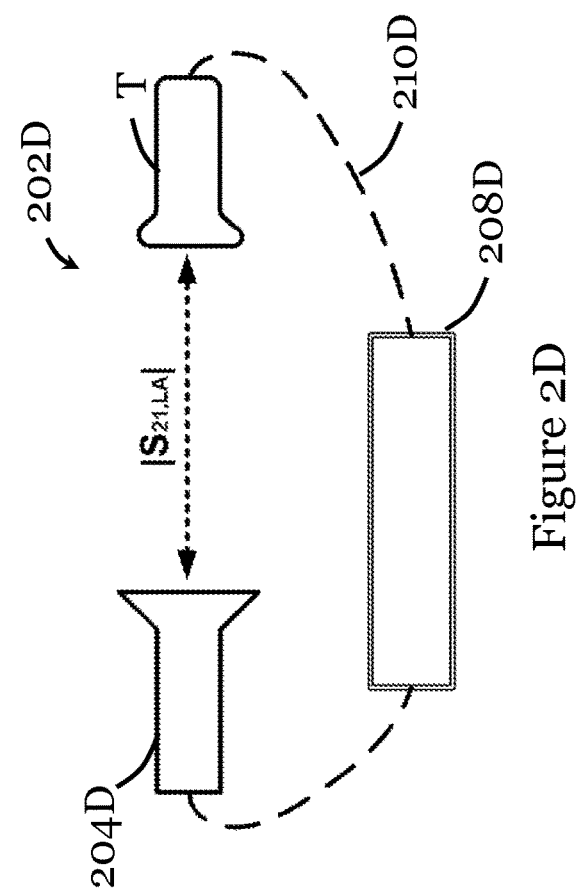
FIG. 2D is schematic diagram showing a setup for measuring an amplitude of a forward gain between a linearly-polarized antenna probe (e.g., the one in FIG. 2C) and a linearly-polarized antenna under test (e.g., the one in FIG. 2B)

FIG. 2D shows an exemplary setup 202D for performing step 102D. In FIG. 2D, the setup 202D is the same to that in FIG. 2C except that the linearly-polarized standard-gain antenna is replaced by a linearly-polarized antenna under test. In FIG. 2D, the setup 202D includes a linearly-polarized antenna probe 204D (e.g., the one in setup 202C) and the linearly-polarized antenna under test T connected to a measurement device 208D via respective antenna feed lines 210D. The distance between the phase centers of the probe 204D and the linearly-polarized antenna under test T remains substantially the same to that of FIG. 2A. The linearly-polarized antenna under test T can be re-positioned by external positioner (not shown) for mapping and determining radiation pattern (e.g. using the measurement device 208D).

In FIGS. 2A to 2D, during measurement, one of the devices (antenna or probe) is arranged to transmit signals to the other device for measurement, and the other one of the devices (antenna or probe) is arranged to receive signals transmitted from the other device. Signal generation and analysis may be facilitated by the measurement device 208A-208D.

Figure 3B:
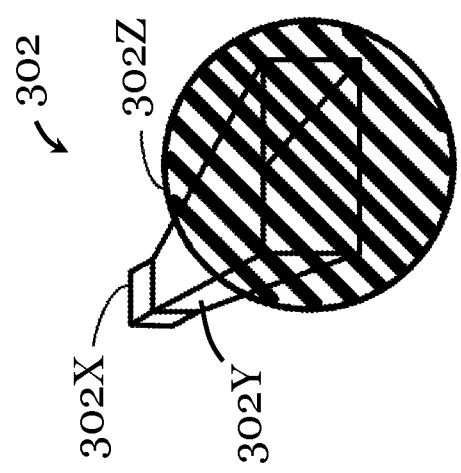
FIG. 3B is a schematic diagram showing a circularly-polarized antenna probe (e.g., the one in FIGS. 2A and 2B) in one embodiment of the invention.
Figure 3A:
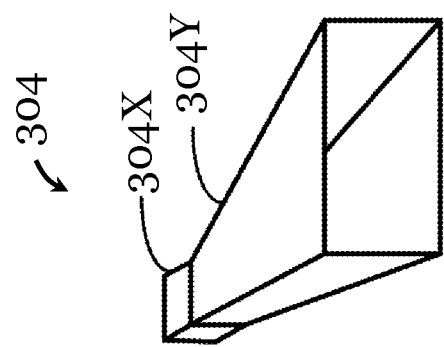
FIG. 3A is a schematic diagram showing a linearly-polarized antenna probe (e.g., the one in FIGS. 2C and 2D) in one embodiment of the invention.

FIG. 3A illustrates an exemplary embodiment of the linearly-polarized antenna probe 304 used in setups 202C and 202D. The linearly-polarized antenna probe 304 is a rectangular horn antenna having a feeding waveguide 304X and a rectangular horn (tapering to widen towards the opening) structure 304Y. The feeding waveguide 304X may be connected to a coaxial line with an adapter.

FIG. 3B illustrates an exemplary embodiment of a circularly-polarized antenna probe 302 used in setups 202A and 202B. The circularly-polarized antenna probe 302 is formed by a linearly-polarized antenna probe and a polarized 302Z placed in front of it. The linearly-polarized antenna probe is a rectangular horn antenna having a feeding waveguide 302X and a rectangular horn structure 302Y (e.g., the one in FIG. 3A). The polarizer 302Z is placed in the front aperture of the feed antenna 302X, 302Y to polarize the incident electromagnetic wave to be circularly-polarized form. The polarizer 302Z may include a combination of periodic strips made by dielectric material where the direction of the strips is about 45 degrees or about 135 degrees to the E-plane of the feed antenna 302X.

Figure 3D:
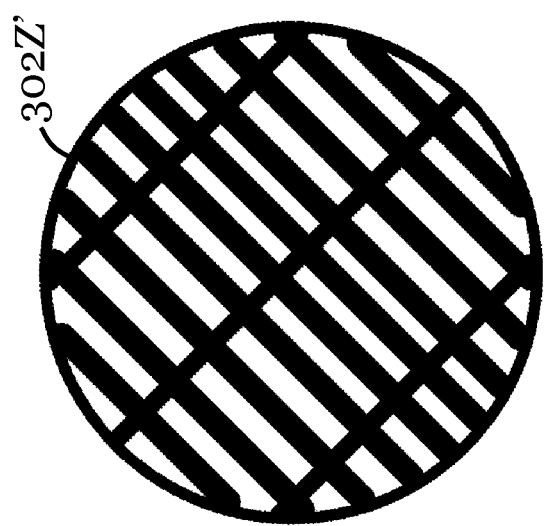
FIG. 3D is a schematic diagram showing a polarizer for a circularly-polarized antenna probe in one embodiment of the invention.
Figure 3C:
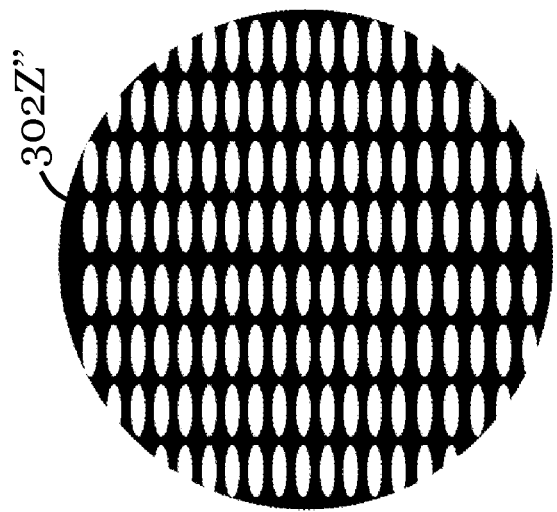
FIG. 3C is a schematic diagram showing a polarizer for a circularly-polarized antenna probe in one embodiment of the invention.

FIGS. 3C and 3D illustrate exemplary constructions of a polarizer 302Z', 302Z" for a circularly-polarized antenna probe. In FIG. 3C, the polarizer 302Z' includes a combination of periodic strips made by dielectric material, where the direction of majority of the strips is placed about 45 degrees to the E-plane of the feed antenna (not shown, but similar to the one in FIG. 3B) and the direction of minority of the strips is placed about 135 degrees to the E-plane of the feed antenna (not shown, but similar to the one in FIG. 3B). This arrangement provides a circularly-polarized antenna probe. In FIG. 3D, the polarizer 302Z" includes a patch made by dielectric material, where the patch include multiple oval openings arranged in an array. This arrangement provides a circularly-polarized antenna probe.

Figure 4:
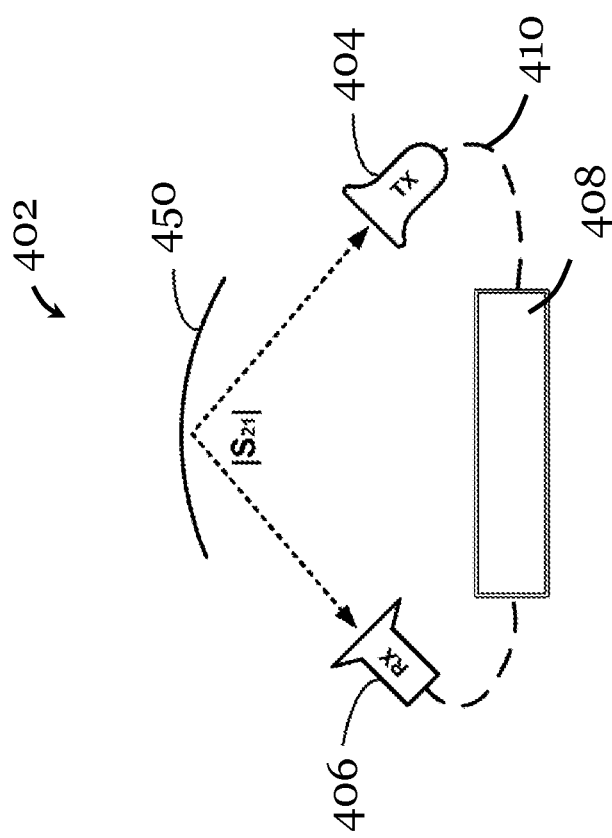
FIG. 4 is schematic diagram showing an alternative setup for measuring an amplitude of the forward gain between a transmitter and a receiver in one embodiment of the invention.

FIG. 4 illustrates an alternative setup 402 for FIGS. 2A to 2D. In applications where space is more confined, a reflector 450 (single-stage as shown) may be used for reflecting signals transmitted from one device to the other. The transmitting device 404 or the receiving device 406 could be one of the circularly-polarized antenna probes, the linearly-polarized standard-gain horn, or the linearly-polarized antenna under test. The signal between the transmitting device 404 and the receiving device 406 (connected via feed lines 410 to measurement device 408) is reflected by the reflector 450 to save space for measurement. In other examples the reflector could be more than one stage.

Figure 5:
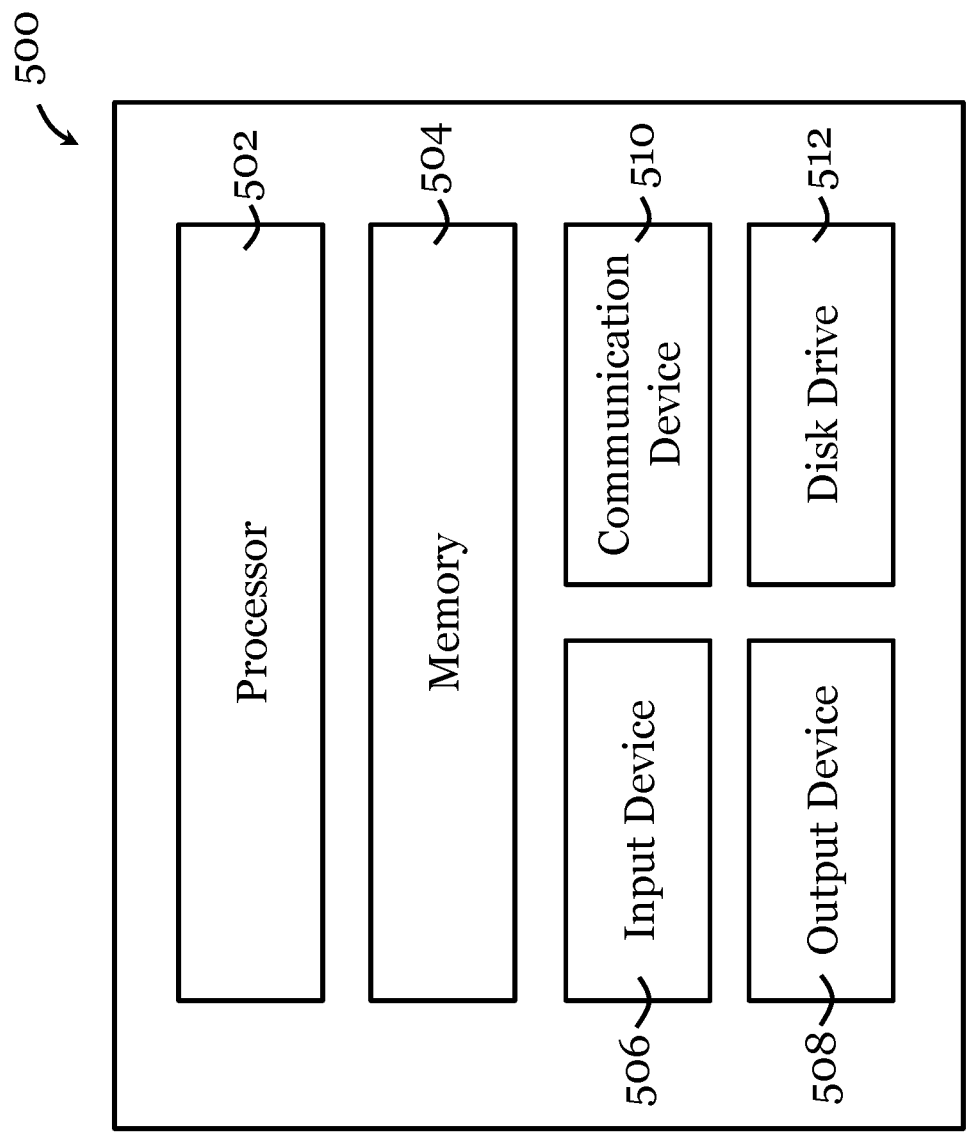
FIG. 5 is a block diagram of an information handling system that can be used to determine gain characteristics of a linearly-polarized antenna in one embodiment of the invention.

Referring to FIG. 5, there is shown a schematic diagram of an exemplary information handling system 500 that can be used as a server or other information processing systems in one embodiment of the invention. The information handling system 500 may be used to determine gain characteristics of a linearly-polarized antenna, for example, in step 104 of the method 100 of the above embodiments. The information handling system 500 may have different configurations, and it generally comprises suitable components necessary to receive, store, and execute appropriate computer instructions, commands, or codes. The main components of the information handling system 500 are a processor 502 and a memory unit 504. The processor 502 may be formed by one or more CPU, MCU, controllers, logic circuits, Raspberry Pi chip, etc. The memory unit 504 may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. Preferably, the information handling system 500 further includes one or more input devices 506 such as a keyboard, a mouse, a stylus, an image scanner, a microphone, a tactile input device (e.g., touch sensitive screen), and an image/video input device (e.g., camera). The information handling system 500 may further include one or more output devices 508 such as one or more displays (e.g., monitor), speakers, disk drives, headphones, earphones, printers, 3D printers, etc. The display may include LCD display, a LED/OLED display, or any other suitable display that may or may not be touch sensitive. The information handling system 500 may further include one or more disk drives 512 which may encompass solid state drives, hard disk drives, optical drives, flash drives, and/or magnetic tape drives. A suitable operating system may be installed in the information handling system 500, e.g., on the disk drive 512 or in the memory unit 504. The memory unit 504 and the disk drive 512 may be operated by the processor 502. The information handling system 500 also preferably includes a communication device 510 for establishing one or more communication links (not shown) with one or more other computing devices such as servers, personal computers, terminals, tablets, phones, or other wireless or handheld computing devices. The communication device 510 may be a modem, a Network Interface Card (NIC), an integrated network interface, a radio frequency transceiver, an optical port, an infrared port, a USB connection, or other wired or wireless communication interfaces. The communication links may be wired or wireless for communicating commands, instructions, information and/or data. Preferably, the processor 502, the memory unit 504, and optionally the input devices 506, the output devices 508, the communication device 510 and the disk drives 512 are connected with each other through a bus, a Peripheral Component Interconnect (PCI) such as PCI Express, a Universal Serial Bus (USB), an optical bus, or other like bus structure. In one embodiment, some of these components may be connected through a network such as the Internet or a cloud computing network. A person skilled in the art would appreciate that the information handling system 500 shown in FIG. 5 is merely exemplary and different information handling systems 500 with different configurations may be applicable in the invention.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the invention are either wholly implemented by computing system or partly implemented by computing systems then any appropriate computing system architecture may be utilized. This will include stand-alone computers, network computers, dedicated or non-dedicated hardware devices. Where the terms "computing system" and "computing device" are used, these terms are intended to include any appropriate arrangement of computer or information processing hardware capable of implementing the function described.

Embodiments of the present invention have provided system and method for determining gain characteristics of a linearly-polarized antenna. The method utilizes amplitude information and a simple setup. Unnecessary rotation of components (e.g., antenna feed or probe) during measurements is reduced or eliminated. As a result, damage to fragile and expensive equipment can be reduced or avoided. The method in the above embodiments is particularly useful for measuring gains of linearly-polarized antennas especially at millimeter-wave and terahertz range. The method greatly simplifies the measuring process and measurement system complexity.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive.

For example, the antenna under test need not be an antenna arranged for operation in millimeter-wave and terahertz ranges, but can be one that is arranged for operation in other wave or frequency ranges. The shape and form and size of the linearly-polarized antenna probe, the circularly-polarized antenna probe, and the linearly-polarized standard-gain antenna can be different from illustrated.

The invention claimed is:

1. A method for determining gain characteristics of a linearly-polarized antenna, comprising:
    receiving a measured first amplitude of a forward gain between a circularly-polarized antenna probe and a linearly-polarized standard-gain antenna, a measured second amplitude of a forward gain between the circularly-polarized antenna probe and a linearly-polarized antenna under test, a measured third amplitude of a forward gain between a linearly-polarized antenna probe and the linearly-polarized standard-gain antenna, and a measured fourth amplitude of a forward gain between the linearly-polarized antenna probe and the linearly-polarized antenna under test; and
    determining a co-polarization gain and a cross-polarization gain of the linearly-polarized antenna under test based on the measured first amplitude, the measured second amplitude, the measured third amplitude, and the measured fourth amplitude.

2. The method of claim 1, further comprising: measuring a first amplitude of a forward gain between the circularly-polarized antenna probe and the linearly-polarized standard-gain antenna to obtain the measured first amplitude.

3. The method of claim 2, wherein measuring the first amplitude of the forward gain between the circularly-polarized antenna probe and the linearly-polarized standard-gain antenna comprises:
    positioning, relatively, the circularly-polarized antenna probe and the linearly-polarized standard-gain antenna, and
    transmitting signals from one of the circularly-polarized antenna probe and the linearly-polarized standard-gain antenna to the other one of the circularly-polarized antenna probe and the linearly-polarized standard-gain antenna for measurement.

4. The method of claim 1, further comprising: measuring a second amplitude of a forward gain between the circularly-polarized antenna probe and the linearly-polarized antenna under test to obtain the measured second amplitude.

5. The method of claim 4, wherein measuring the second amplitude of the forward gain between the circularly-polarized antenna probe and the linearly-polarized antenna under test comprises:
positioning, relatively, the circularly-polarized antenna probe and the linearly-polarized antenna under test, and
transmitting signals from one of the circularly-polarized antenna probe and the linearly-polarized antenna under test to the other one of the circularly-polarized antenna probe and the linearly-polarized antenna under test for measurement.

6. The method of claim 1, further comprising: measuring a third amplitude of a forward gain between the linearly-polarized antenna probe and the linearly-polarized standard-gain antenna to obtain the measured third amplitude.

7. The method of claim 6, wherein measuring the third amplitude of the forward gain between the linearly-polarized antenna probe and the linearly-polarized standard-gain antenna comprises:
positioning, relatively, linearly-polarized antenna probe and the linearly-polarized standard-gain antenna, and
transmitting signals from one of linearly-polarized antenna probe and the linearly-polarized standard-gain antenna to the other one of the linearly-polarized antenna probe and the linearly-polarized standard-gain antenna for measurement.

8. The method of claim 1, further comprising: measuring a fourth amplitude of a forward gain between the linearly-polarized antenna probe and the linearly-polarized antenna under test to obtain the measured fourth amplitude.

9. The method of claim 8, wherein measuring the fourth amplitude of the forward gain between the linearly-polarized antenna probe and the linearly-polarized antenna under test comprises:
positioning, relatively, the circularly-polarized antenna probe and the linearly-polarized standard-gain antenna, and
transmitting signals from one of the circularly-polarized antenna probe and the linearly-polarized standard-gain antenna to the other one of the circularly-polarized antenna probe and the linearly-polarized standard-gain antenna for measurement.

10. The method of claim 1, wherein the circularly-polarized antenna probe comprises a linearly-polarized antenna and a polarizer.

11. The method of claim 1, further comprising:
measuring a first amplitude of a forward gain between the circularly-polarized antenna probe and the linearly-polarized standard-gain antenna to obtain the measured first amplitude;
measuring a second amplitude of a forward gain between the circularly-polarized antenna probe and the linearly-polarized antenna under test to obtain the measured second amplitude;
measuring a third amplitude of a forward gain between the linearly-polarized antenna probe and the linearly-polarized standard-gain antenna to obtain the measured third amplitude; and
measuring a fourth amplitude of a forward gain between the linearly-polarized antenna probe and the linearly-polarized antenna under test to obtain the measured fourth amplitude.

12. The method of claim 11, wherein a relative position between the circularly-polarized antenna probe and the linearly-polarized standard-gain antenna during the measurement of the first amplitude, a relative position between the circularly-polarized antenna probe and the linearly-polarized antenna under test during the measurement of the second amplitude, a relative position between the linearly-polarized antenna probe and the linearly-polarized standard-gain antenna during the measurement of the third amplitude, and a relative position between the linearly-polarized antenna probe and the linearly-polarized antenna under test during the measurement of the fourth amplitude are substantially the same.

13. The method of claim 11, wherein the first amplitude, the second amplitude, the third amplitude, and the fourth amplitude are measured using the same measurement device.

14. The method of claim 1, wherein the co-polarization gain and the cross-polarization gain of the linearly-polarized antenna under test are determined based on:

$$G_{AUT,co} = \frac{G_{SGA,LP}}{(\cos^2\varphi_{LA} - \sin^2\varphi_{LA})} \cdot \left( \frac{|S_{21,LA}|^2}{|S_{21,LS}|^2}\cos^2\varphi_{LS} - \frac{|S_{21,CA}|^2}{|S_{21,CS}|^2}\sin^2\varphi_{LA} \right)$$

$$G_{AUT,crx} = \frac{G_{SGA,LP}}{(\cos^2\varphi_{LA} - \sin^2\varphi_{LA})} \cdot \left( \frac{|S_{21,CA}|^2}{|S_{21,CS}|^2}\cos^2\varphi_{LA} - \frac{|S_{21,LA}|^2}{|S_{21,LS}|^2}\cos^2\varphi_{LS} \right)$$

where
$G_{AUT,co}$ is the co-polarization gain of the linearly-polarized antenna under test,
$G_{AUT,crx}$ is the cross-polarization gain of the linearly-polarized antenna under test,
$G_{SGA,LP}$ is a linearly-polarized gain of the linearly-polarized standard-gain antenna,
$|S_{21,CS}|$ is the measured first amplitude,
$|S_{21,CA}|$ is the measured second amplitude,
$|S_{21,LS}|$ is the measured third amplitude,
$|S_{21,LA}|$ is the measured fourth amplitude,
$\varphi_{LS}$ is an angle between an E-plane of the linearly-polarized antenna probe and an E-plane of the linearly-polarized standard-gain antenna during measurement of the third amplitude, and
$\varphi_{LA}$ is an angle between an E-plane of the linearly-polarized antenna probe and an E-plane of the linearly-polarized antenna under test during measurement of the fourth amplitude.

15. The method of claim 1, wherein the co-polarization gain and the cross-polarization gain of the linearly-polarized antenna under test are determined using one or more processors.

16. The method of claim 1, wherein the linearly-polarized antenna under test is arranged for operation in millimeter-wave and terahertz ranges.

17. A method for evaluating a performance of a linearly-polarized antenna, comprising:
determining gain characteristics of a linearly-polarized antenna using the method of claim 1, and
determining the radiation pattern of the linearly-polarized antenna.

18. A system for determining gain characteristics of a circularly-polarized antenna, comprising:
one or more processors arranged to
receive a measured first amplitude of a forward gain between a circularly-polarized antenna probe and a linearly-polarized standard-gain antenna, a measured second amplitude of a forward gain between the circularly-polarized antenna probe and a linearly-polarized antenna under test, a measured third amplitude of a forward gain between a linearly-polarized antenna probe and the linearly-polarized standard-gain antenna, and a measured fourth amplitude of a forward gain between the linearly-polarized antenna probe and the linearly-polarized antenna under test; and determine a co-polarization gain and a cross-polarization gain of the linearly-polarized antenna under test based on the measured first amplitude, the measured second amplitude, the measured third amplitude, and the measured fourth amplitude.

19. The system of claim 18, further comprising:
a measurement device arranged to:
  measure a first amplitude of a forward gain between the circularly-polarized antenna probe and the linearly-polarized standard-gain antenna to obtain the measured first amplitude;
  measure a second amplitude of a forward gain between the circularly-polarized antenna probe and the linearly-polarized antenna under test to obtain the measured second amplitude;
  measure a third amplitude of a forward gain between the linearly-polarized antenna probe and the linearly-polarized standard-gain antenna to obtain the measured third amplitude; and
  measure a fourth amplitude of a forward gain between the linearly-polarized antenna probe and the linearly-polarized antenna under test to obtain the measured fourth amplitude.

20. The system of claim 18, wherein the one or more processors are arranged to determine the co-polarization gain and the cross-polarization gain of the linearly-polarized antenna under test based on:

$$G_{AUT,co} = \frac{G_{SGA,LP}}{(\cos^2\varphi_{LA} - \sin^2\varphi_{LA})} \cdot \left( \frac{|S_{21,LA}|^2}{|S_{21,LS}|^2}\cos^2\varphi_{LS} - \frac{|S_{21,CA}|^2}{|S_{21,CS}|^2}\sin^2\varphi_{LA} \right)$$

$$G_{AUT,crx} = \frac{G_{SGA,LP}}{(\cos^2\varphi_{LA} - \sin^2\varphi_{LA})} \cdot \left( \frac{|S_{21,CA}|^2}{|S_{21,CS}|^2}\cos^2\varphi_{LA} - \frac{|S_{21,LA}|^2}{|S_{21,LS}|^2}\cos^2\varphi_{LS} \right)$$

where
$G_{AUT,co}$ is the co-polarization gain of the linearly-polarized antenna under test,
$G_{AUT,crx}$ is the cross-polarization gain of the linearly-polarized antenna under test,
$G_{SGA,LP}$ is a linearly-polarized gain of the linearly-polarized standard-gain antenna,
$|S_{21,CS}|$ is the measured first amplitude,
$|S_{21,CA}|$ is the measured second amplitude,
$|S_{21,LS}|$ is the measured third amplitude,
$|S_{21,LA}|$ is the measured fourth amplitude,
$\varphi_{LS}$ is an angle between an E-plane of the linearly-polarized antenna probe and an E-plane of the linearly-polarized standard-gain antenna during measurement of the third amplitude, and
$\varphi_{LA}$ is an angle between an E-plane of the linearly-polarized antenna probe and an E-plane of the linearly-polarized antenna under test during measurement of the fourth amplitude.

* * * * *